(12) United States Patent
Likhanskii et al.

(10) Patent No.: US 10,886,098 B2
(45) Date of Patent: Jan. 5, 2021

(54) ELECTROSTATIC FILTER AND ION IMPLANTER HAVING ASYMMETRIC ELECTROSTATIC CONFIGURATION

(71) Applicant: APPLIED Materials, Inc., Santa Clara, CA (US)

(72) Inventors: Alexandre Likhanskii, Malden, MA (US); Frank Sinclair, Boston, MA (US); Shengwu Chang, South Hamilton, MA (US); Eric D. Hermanson, Georgetown, MA (US); Nevin H. Clay, Gloucester, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 88 days.

(21) Appl. No.: 16/197,251

(22) Filed: Nov. 20, 2018

(65) Prior Publication Data

US 2020/0161077 A1   May 21, 2020

(51) Int. Cl.
*H01J 37/05*   (2006.01)
*H01J 37/12*   (2006.01)
*H01J 37/08*   (2006.01)
*H01J 37/147*   (2006.01)
*H01J 37/317*   (2006.01)

(52) U.S. Cl.
CPC .............. *H01J 37/05* (2013.01); *H01J 37/08* (2013.01); *H01J 37/12* (2013.01); *H01J 37/147* (2013.01); *H01J 37/3171* (2013.01); *H01J 2237/053* (2013.01); *H01J 2237/057* (2013.01)

(58) Field of Classification Search
CPC .......... H01J 37/05; H01J 37/12; H01J 37/147; H01J 37/08; H01J 37/3171; H01J 2237/057; H01J 2237/053

USPC ................................ 250/396 R, 492.1–492.3
See application file for complete search history.

(56) References Cited

U.S. PATENT DOCUMENTS

| | | |
|---|---|---|
| 6,326,631 B1 | 12/2001 | Politiek et al. |
| 6,573,517 B1 | 6/2003 | Sugitani et al. |
| 7,022,984 B1 | 4/2006 | Rathmell et al. |

(Continued)

FOREIGN PATENT DOCUMENTS

| | | |
|---|---|---|
| JP | 2010123547 A | 6/2010 |
| JP | 2015191740 A | 11/2015 |

(Continued)

OTHER PUBLICATIONS

International Search Report and Written Opinion dated Apr. 28, 2020, for the International Patent Application No. PCT/US2019/059075, filed on Oct. 31, 2019, 8 pages.

(Continued)

*Primary Examiner* — Michael Maskell
(74) *Attorney, Agent, or Firm* — Kacvinsky Daisak Bluni PLLC

(57) ABSTRACT

An apparatus may include a main chamber, an entrance tunnel, having an entrance axis extending into the main chamber, and an exit tunnel, connected to the main chamber and defining an exit axis, wherein the entrance tunnel and the exit tunnel define a beam bend of less than 25 degrees therebetween. The apparatus may include an electrode assembly, disposed in the main chamber, on a lower side of the exit tunnel; and a catch assembly, disposed within the main chamber, in a line of sight from an exterior aperture of the exit tunnel.

19 Claims, 5 Drawing Sheets

(56) References Cited

U.S. PATENT DOCUMENTS

| | | |
|---|---|---|
| 7,326,941 B2 | 2/2008 | Chen et al. |
| 7,888,653 B2 | 2/2011 | Kellerman et al. |
| 8,129,695 B2 | 3/2012 | Kellerman et al. |
| 8,389,964 B2 | 3/2013 | Igo et al. |
| 9,293,295 B2 | 3/2016 | Yagita |
| 2004/0013820 A1 | 1/2004 | Cadieu |
| 2009/0189096 A1 | 7/2009 | Chen et al. |
| 2010/0065761 A1 | 3/2010 | Graf et al. |
| 2011/0163229 A1 | 7/2011 | Frosien et al. |
| 2012/0104273 A1 | 5/2012 | Ryding et al. |
| 2012/0168637 A1 | 7/2012 | Radovanov et al. |
| 2013/0119263 A1 | 5/2013 | Smick et al. |
| 2015/0279612 A1 | 10/2015 | Yagita |
| 2015/0380206 A1 | 12/2015 | White et al. |
| 2016/0089912 A1 | 3/2016 | Chiba et al. |
| 2016/0111245 A1 | 4/2016 | Saadatmand et al. |
| 2016/0189912 A1 | 6/2016 | Eisner et al. |
| 2018/0218894 A1 | 8/2018 | Likhanskii |
| 2019/0259560 A1* | 8/2019 | Chang ............... H01J 37/05 |

FOREIGN PATENT DOCUMENTS

| | | |
|---|---|---|
| KR | 10-2012-0116451 A | 10/2012 |
| WO | 2007013869 A1 | 2/2007 |
| WO | 2013106220 A1 | 7/2013 |

OTHER PUBLICATIONS

International Search Report and Written Opinion dated Apr. 9, 2020, for the International Patent Application No. PCT/US2019/059067, filed on Oct. 31, 2019, 9 pages.

International Search Report and Written Opinion dated Apr. 9, 2020, for the International Patent Application No. PCT/US2019/059069, filed on Oct. 31, 2019, 10 pages.

International Search Report and Written Opinion dated Apr. 9, 2020, for the International Patent Application No. PCT/US2019/059079, filed on Oct. 31, 2019, 07 pages.

* cited by examiner

ELECTROSTATIC FILTER AND ION IMPLANTER HAVING ASYMMETRIC ELECTROSTATIC CONFIGURATION

FIELD OF THE DISCLOSURE

The disclosure relates generally to apparatus and techniques for implanting substrates, and more particularly, to improved energy filters for ion beams.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens and an electrostatic filter to control ion beam energy, ion beam shape, and ion beam size. The electrostatic module may accelerate or decelerate an ion beam to a final energy, while altering the direction of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The electrodes may be arranged as rods spaced equidistant from an ion beam. The rod/electrode potentials are set to create electric fields in the electrostatic module causing the ion beam to decelerate, deflect and focus the ion beam.

In some configurations of electrostatic modules, a given number of electrodes, such as five or seven pairs of electrodes may be used to deflect, decelerate, and focus ion beam before in a main chamber of the electrostatic module before exiting at a final beam energy before striking a substrate. To maintain electrodes in proper working order, periodic maintenance may be performed to clean the main chamber as well as electrodes, to remove debris, such as flakes, or other material accumulating during use of the electrostatic module. For example, material from the substrate may be resputtered during implantation, and may be transported back onto surfaces of electrodes or other surfaces within the electrostatic module. Such material may accumulate on electrodes in a manner that promotes flaking or other erosion of material, which eroded material may in part transport onto the substrate as atomic level, microscopic or macroscopic particles or debris. In addition, known electrostatic filters may present surfaces that attract ions and generate sputtered material that transports from the electrostatic filter to a substrate.

With respect to these and other considerations the present disclosure is provided.

BRIEF SUMMARY

In one embodiment, an apparatus may include, a main chamber, an entrance tunnel, having an entrance axis extending into the main chamber, and an exit tunnel, connected to the main chamber and defining an exit axis, wherein the entrance tunnel and the exit tunnel define a beam bend of less than 25 degrees therebetween. The apparatus may include an electrode assembly, disposed in the main chamber, on a lower side of the exit tunnel; and a catch assembly, disposed within the main chamber, in a line of sight from an exterior aperture of the exit tunnel.

In a further embodiment, ion implanter may include an ion source to generate an ion beam, and an electrostatic filter, disposed downstream of the ion source, to control the ion beam. The electrostatic filter may include a main chamber, an entrance tunnel, having an entrance axis extending into the main chamber, and an exit tunnel, connected to the main chamber and defining an exit axis, wherein the entrance tunnel and the exit tunnel define a beam bend of less than 25 degrees therebetween. The electrostatic filter may further include an electrode assembly, disposed in the main chamber, on a lower side of the exit tunnel; and a catch assembly, disposed within the main chamber, in a line of sight from an exterior aperture of the exit tunnel.

In an additional embodiment, an electrostatic filter may include a main chamber, including a chamber wall, set at ground potential, an entrance tunnel, biased at a first potential and having an entrance axis extending into the main chamber, and an exit tunnel, connected to the main chamber and defining an exit axis. The entrance tunnel and the exit tunnel may define a beam bend of less than 25 degrees therebetween. The electrostatic filter may include an electrode assembly, disposed in the main chamber, on a lower side of the exit tunnel, and a catch assembly, set at ground potential, and disposed within the main chamber, in a line of sight from an exterior aperture of the exit tunnel.

Figure 1:
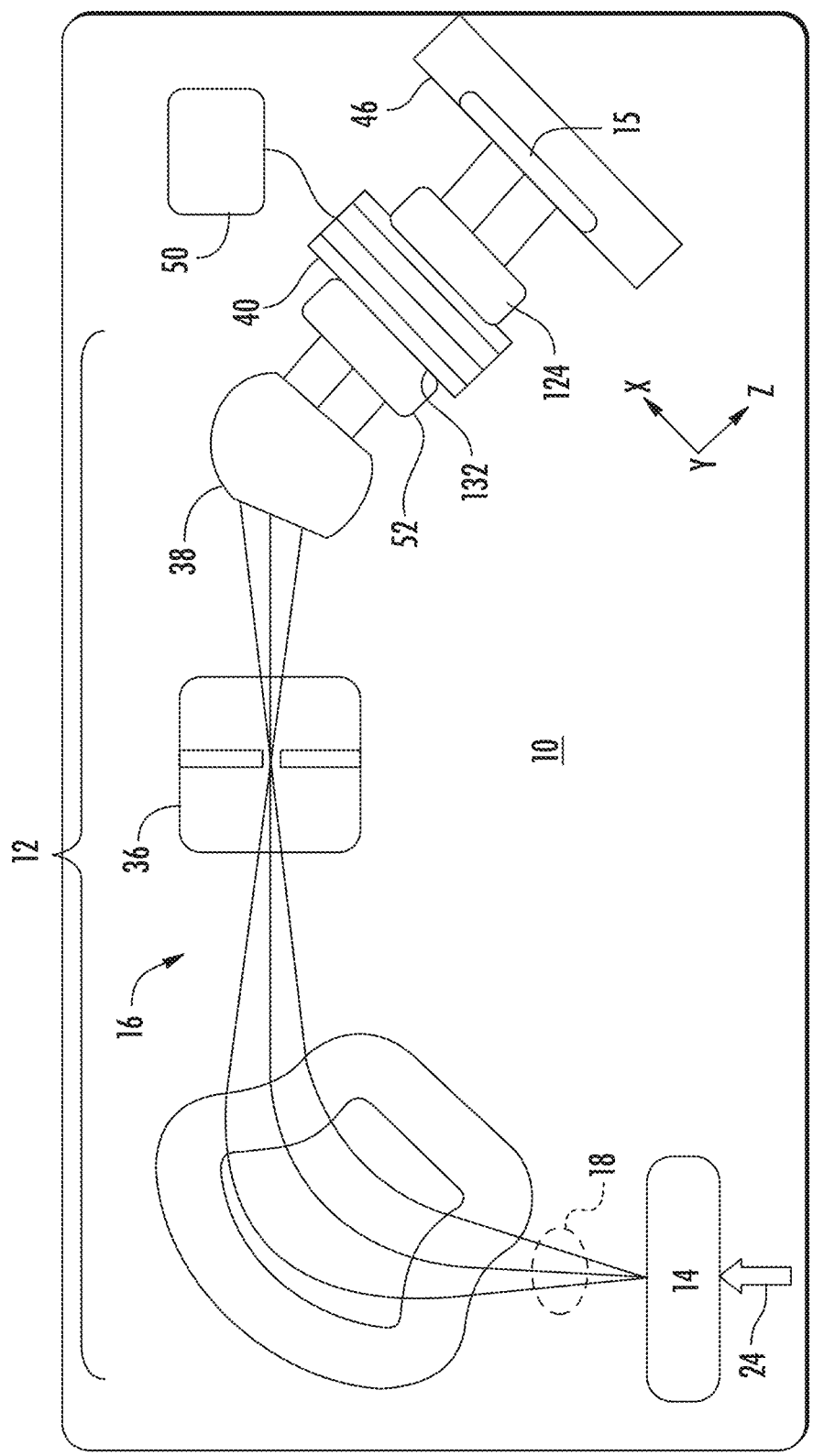
FIG. 1 shows an exemplary embodiment demonstrating an ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved operation and reliability of an electrostatic module acting as an electrostatic filter, for example. In exemplary embodiments, an electrostatic filter is disclosed having a novel architecture, including novel arrangement of an electrode assembly in a main chamber of the electrostatic module.

Referring now to FIG. 1, an exemplary embodiment demonstrating a system 10 is shown, where the system 10 may be used for ion implantation system in accordance with the present disclosure. The system 10 includes, among other components, an ion source 14 for producing an ion beam 18, such as a ribbon beam or a spot beam, and a series of beam-line components. The ion source 14 may comprise a chamber for receiving a flow of gas 24 and generates ions. The ion source 14 may also comprise a power source and an extraction electrode assembly disposed near the chamber. The beamline extending from the ion source 14 to an electrostatic filter 40 may be deemed an upstream beamline 12. In some non-limiting embodiments, the beam-line components 16 of the upstream beamline may include, for example, a mass analyzer 34, a first acceleration or deceleration stage 36, and a collimator 38, disposed upstream of the electrostatic filter 40, which filter may provide deceleration and/or acceleration or the ion beam 18.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate 15 mounted on a platen or clamp within a process chamber 46. The substrate may be moved in one or more dimensions (e.g., translate, rotate, and tilt).

The electrostatic filter 40 is a beam-line component configured to independently control deflection, deceleration, and focus of the ion beam 18. In some embodiments, the electrostatic filter 40 is a vertical electrostatic energy filter (VEEF) or electrostatic filter EF. As will be described in greater detail below, the electrostatic filter 40 may be arranged as an electrode assembly defining at least one electrode configuration. The electrode configuration may include a plurality of electrodes arranged in series along the beamline to process the ion beam 18 through the electrostatic filter 40. In some embodiments, the electrostatic filter may include a set of upper electrodes disposed above the ion beam 18 and a set of lower electrodes disposed below the ion beam 18. A difference in potentials between the set of upper electrodes and the set of lower electrodes may also be varied along the central ion beam trajectory to deflect the ion beam at various points along the central ray trajectory (CRT). The system 10 may further include an electrode voltage supply, shown as electrode voltage assembly 50, as well as an entrance tunnel 52, coupled to the electrostatic filter 40, where the operation of the tuner voltage assembly is described below. As further shown in FIG. 1, the system 10 may include an entrance tunnel 52, arranged just upstream o the electrostatic filter 40, or forming an upstream portion of the electrostatic filter 40, to guide the ion beam 18 into the electrostatic filter 40. As disclosed in the embodiments to follow, the entrance tunnel 52 and electrodes within the electrostatic filter 40 may be arranged in a novel configuration to improve operation of the system 10.

Figure 2:
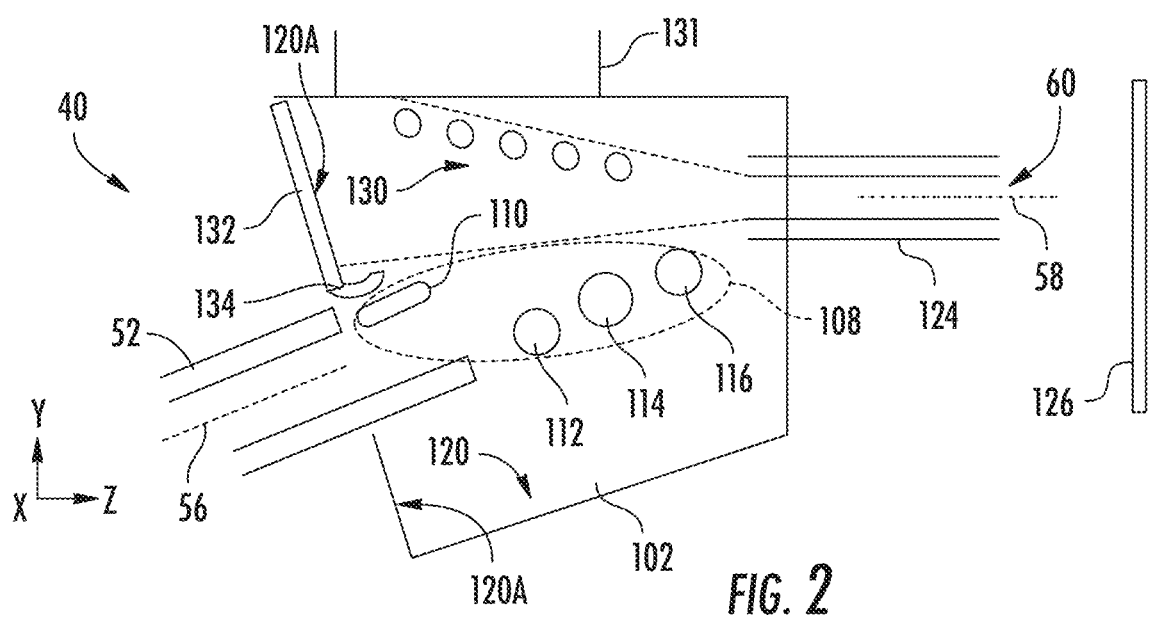
FIG. 2 show the structure of an electrostatic filter, according to exemplary embodiments of the disclosure.

Referring now to FIG. 2, the structure of one variant of the electrostatic filter 40 is shown. In FIG. 2, there is shown a side cross-sectional view the electrostatic filter 40, entrance tunnel 52, and exit tunnel 124. As shown, the electrostatic filter 40 includes a main chamber 102, extending above and partially encasing electrostatic filter 40. The entrance tunnel 52 may define an entrance axis 56, while the exit tunnel defines an exit axis 58, where in some embodiments, a beam bend, the angle between the entrance axis and the exit axis, is 25 degrees or less.

The electrostatic filter 40 includes electrode assembly 108, including electrode 110, electrode 112, electrode 114, and electrode 116. As shown in FIG. 2, the plurality of electrodes are arranged in an asymmetric configuration. For example, in the specific embodiment shown in FIG. 2, the electrode assembly 108 comprises just one upper electrode, shown as electrode 110. In some embodiments, the upper electrode may, but need not, comprise an elongated cross-section, as shown in FIG. 2. The provision of an elongated cross-section, allows the upper electrode to be relatively thin along a vertical direction, to remain out of the line of sight from the substrate. At the same time, the elongation, generally along the horizontal direction allows the upper electrode to bend an incoming beam without requiring excessively high voltage. In addition, the elongated cross-section may have rounded corners as shown to minimize electrostatic stresses.

As further shown in FIG. 2, the electrode assembly 108 is disposed just on the lower side of the exit tunnel 124, meaning below a plane of the lower surface of the exit tunnel 124 (parallel to the X-Y plane of the Cartesian coordinate system shown). The electrode assembly 108 may further be arranged so the "upper electrode," meaning the electrode 110, is disposed well below the exit tunnel 124. In some embodiments, the upper electrode of an electrode assembly is disposed at a first distance below the exit tunnel 124, where a last electrode of the plurality of lower electrodes (see electrode 116) is disposed at a second distance below the exit tunnel, less than the first distance. This configuration places the upper electrode further below the exit tunnel 124 than the nearest lower electrode, helping further reduce contamination, as discussed below.

In various embodiments, the entrance tunnel 52 may be configured having an asymmetric structure, where a lower portion of the entrance tunnel 52 extends into the main chamber 102 to a further extent than the upper portion, as illustrated in FIG. 2. This configuration allows placement of the electrode 110, closer to the entrance side of the main chamber 102, which placement may be advantageous in shaping and transporting ion beams through the electrostatic filter 40, discussed below.

As further shown in FIG. 2, the electrostatic filter 40 may include a chamber wall 120, where the chamber wall 120 is disposed on the interior of the main chamber 102. In the embodiment of FIG. 2, the entrance tunnel extends through an entrance wall 120A of the main chamber 102. According to some embodiments, a catch assembly 132 may be disposed as part of the entrance wall 120A. In various embodiments, the catch assembly 132 may include a catch ledge 134. The catch ledge 134 may extend at an angle from the entrance wall 120A, such as horizontally, at the lower end of the catch assembly 132.

In the configuration of FIG. 2, and according to various embodiments, the electrode assembly 108 is not disposed in a line of sight from an exterior aperture 60, and thus is not disposed in a line of sight from a substrate 126, where the substrate 126 is disposed downstream of the electrostatic filter 40. More generally, according to various embodiments, biased surfaces within the electrostatic filter 40 are not disposed within the line of sight of the substrate 126, indicated by the dashed lines extending from the exit tunnel 124. These biased surfaces may be surfaces coupled to a negative potential to be placed in a biased state, including electrodes of the electrode assembly 108, as well as the entrance tunnel 52.

Figure 3:
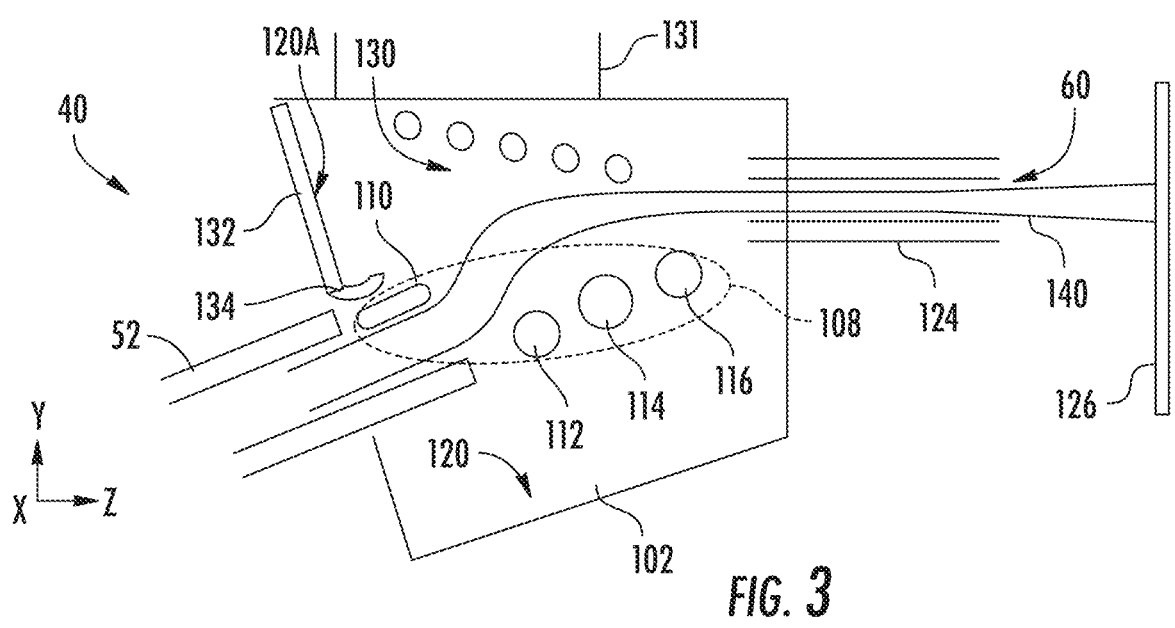
FIG. 3 illustrates an exemplary operation of the electrostatic filter under of FIG. 2 under one mode of operation, according to embodiments of the disclosure.

Turning FIG. 3 there is shown one example of operation of the electrostatic filter, where an ion beam 140 is transported through the electrostatic filter 40 and to the substrate 126, after the appropriate steering, focus, and deceleration of the ion beam 140.

To transport the ion beam 140 from the entrance tunnel 52 to the exit tunnel 124 and onto the substrate 126, the appropriate voltages are applied to the various components of the electrostatic filter 40, using the electrode voltage assembly 50. As an example, the entrance tunnel 52 may be set at beam potential, the initial voltage of the ion beam 140, before processing by the electrostatic filter 40. Various surfaces in the electrostatic filter 40 may be set at ground potential, including the chamber walls 120, such as the catch assembly 132 and the exit tunnel 124. Negative voltages may be applied to at least some of the electrodes of the electrode assembly 108, to deflect, decelerate, accelerate, and focus the ion beam 140. For example, in one configuration a set of voltages may be applied to the electrode 110 and electrode 112 in a manner that accelerates the ion beam 140, while deflecting the ion beam 140 in a first direction (toward the left and upwardly). Other voltages may be applied to other electrodes of the electrode assembly 108, to deflect the ion beam 140 in a second direction (to the right and downwardly), and to decelerate the ion beam 140.

In order to guide the ion beam 140 along the path shown in FIG. 2, a ground assembly 130 may be provided in the electrostatic filter, where the ground assembly being disposed above the electrode assembly 108, and also above the ion beam 140. The ground assembly 130 may be disposed at ground potential or set at ground potential. As a result, the combination of electrostatic potential applied to ground assembly 130, chamber walls 120, and electrode assembly 108 may guide the ion beam through the electrostatic filter and through the exit tunnel 124, to strike the substrate 126 as shown. The ground assembly 130 may be configured in different ways according to different embodiments of the disclosure. The ground assembly 130 may include a plurality of structures, such as rods, beams, a mesh, or similar features.

In some embodiments, the ground assembly 130 may be arranged in a porous manner, wherein a plurality of apertures are disposed between the plurality of structures of the ground assembly that are set at ground potential. This porous structure of the ground assembly 130 permits gas to flow through the ground assembly, so that pumping may take place above the ground assembly 130 (see port 131) to vent gaseous species as appropriate.

Returning to FIG. 2, an advantage of the configuration of electrostatic filter 40 is the protection of biased surfaces from material originating at the substrate. For example, material sputtered by the ion beam 140 at the substrate 126 may be directed along linear trajectories back into the main chamber 102. Because the electrode assembly 108 is not disposed in a line of sight manner from the substrate 126, sputtered material may tend not to condense on the electrode assembly 108, avoiding buildup of material thereon. Instead, sputtered material from the substrate 126 may tend to condense on the catch assembly 132. In addition, as sputtered material forms a layer on the entrance wall 120A, the catch ledge may collect microscopic or macroscopic debris from any layer of portions of a layer on the entrance wall 120, if flaking or other erosion takes place.

According to different embodiments, the electrostatic filter 40 may be operated over a wide range of ion beam processing conditions, including low energy, such as 1 keV to medium energy, such as 80 keV.

In accordance with various embodiments, the electrodes of electrode assembly 108 may be elongated along the X-axis of the Cartesian coordinate system shown. As such, the electrodes may be useful for controlling a ribbon beam having a cross-section, also elongated along the X-axis, where the ribbon beam may be tens of centimeters wide along the X-axis and may have a height on the order of several centimeters. The embodiments are not limited in this context.

In various embodiments, the electrostatic filter 40 may include a plasma flood gun (not shown), where the plasma flood gun abuts the main chamber 102 and includes the exit tunnel 124. Such a plasma flood gun may be arranged to operate according to the principles of known plasma flood guns.

Figure 4:
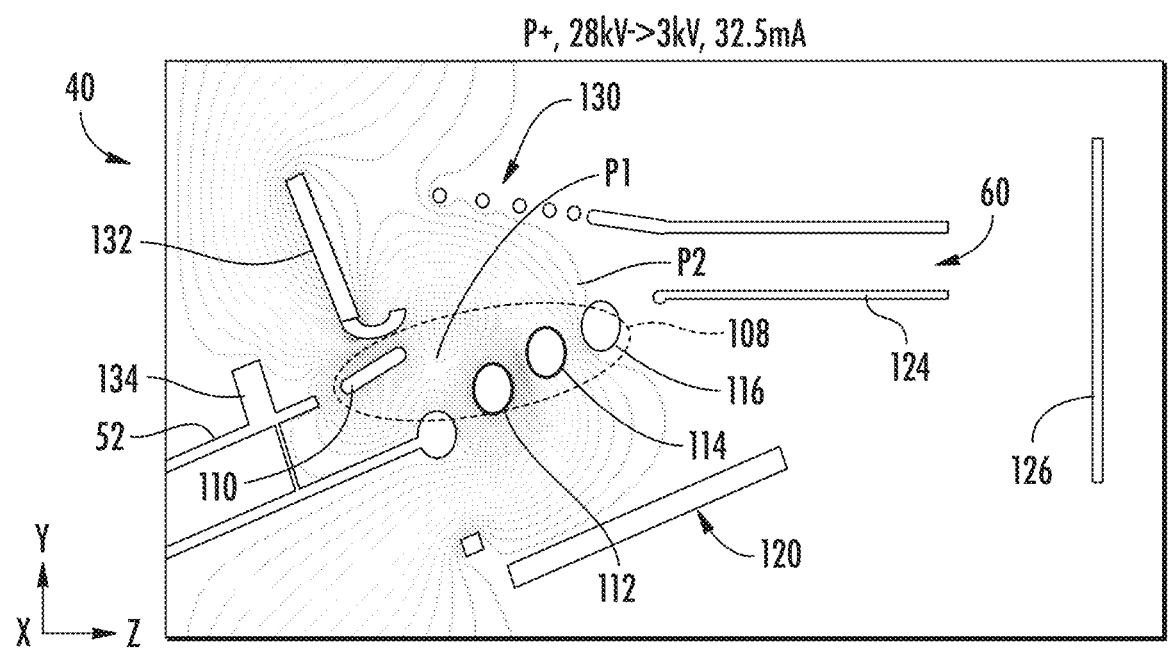
FIG. 4 illustrates a simulation of an exemplary electrostatic filter under one mode of operation, according to other embodiments of the disclosure.

Turning now to FIG. 4, there is shown a variant of the electrostatic filter 40, where a simulation of an exemplary electrostatic configuration is shown, suitable for transport of a 3 kV P+ ion beam, delivering approximately 32.5 mA current to the substrate 126. For example, the configuration of FIG. 4 may represent deceleration of phosphorous ion beam having an initial energy of 28 keV to a final energy of 3 keV. In this configuration, the electrode 112 and electrode 110 are negatively biased to initially accelerate an ion beam, while deflecting to the left. Electrode 114 is biased to decelerate the ion beam and deflect the ion beam to the right, while electrode 116 is set at ground potential. In this configuration, the deceleration path (approximately between points P1 and P2) is relatively shorter, facilitating relatively greater current transport to the substrate, given the relatively lower beam energy, since current transport through the electrostatic filter is inversely proportional to the deceleration path length.

Figure 5:
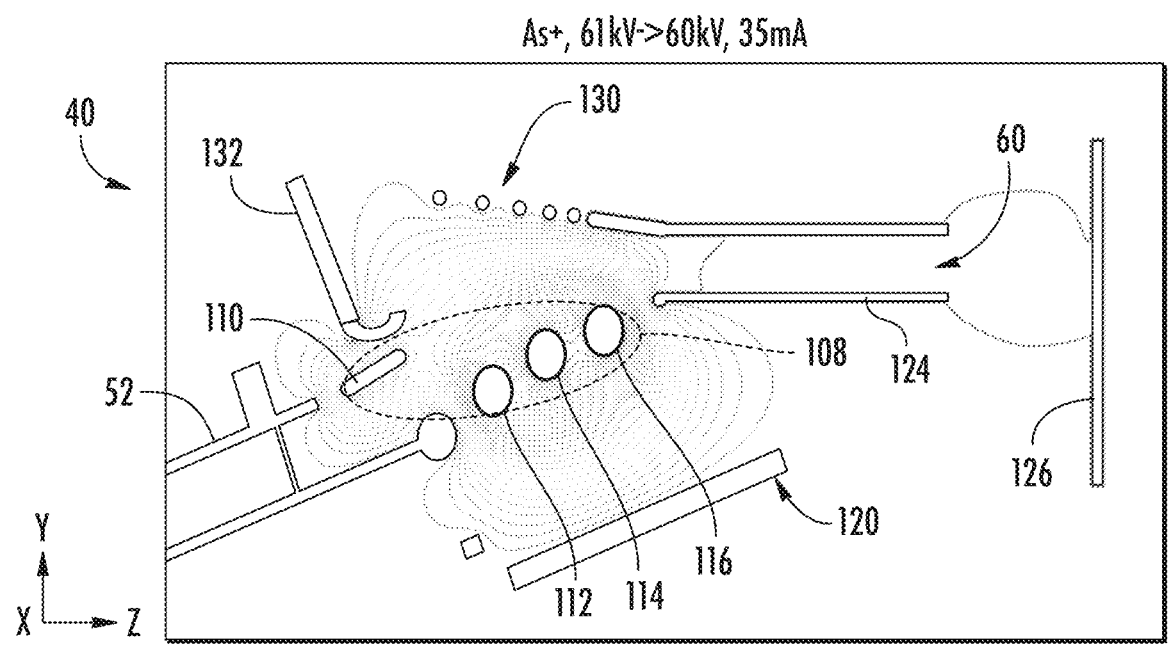
FIG. 5 illustrates a simulation of an exemplary electrostatic filter under one mode of operation, according to further embodiments of the disclosure.

Turning now to FIG. 5, there is shown a variant of the electrostatic filter 40, where a simulation of an exemplary electrostatic configuration is shown, suitable for transport of a 60 kV As+ ion beam, delivering approximately 35 mA current to the substrate 126. For example, the configuration of FIG. 5 may represent deceleration of arsenic ion beam having an initial energy of 61 keV to a final energy of 60 keV. In this configuration, the entrance tunnel 52 is held at −1 kV, the electrode 110 is kept at ~−30 kV, and electrode 112, electrode 114, and electrode 116s are kept at ~−55-60 kV. The rest of the surfaces of the electrostatic filter 40 are grounded (set at a grounded state).

Figure 6:
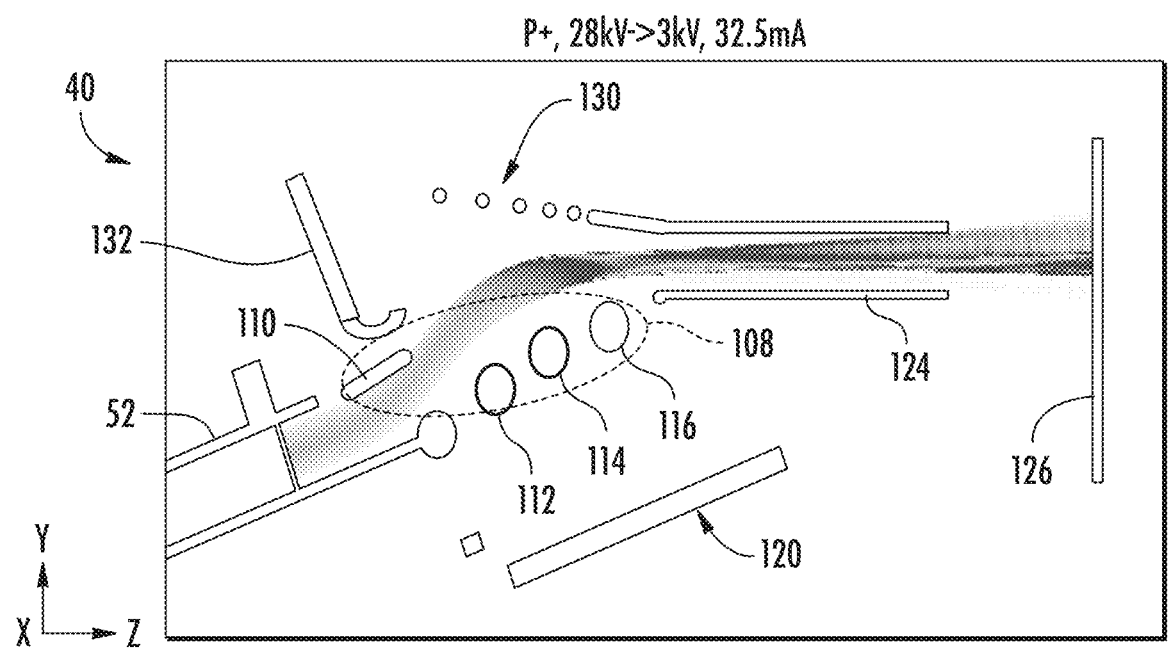
FIG. 6 illustrates a simulation of an ion beam transport in the exemplary electrostatic filter configuration of FIG. 4, according to additional embodiments of the disclosure.
Figure 7:
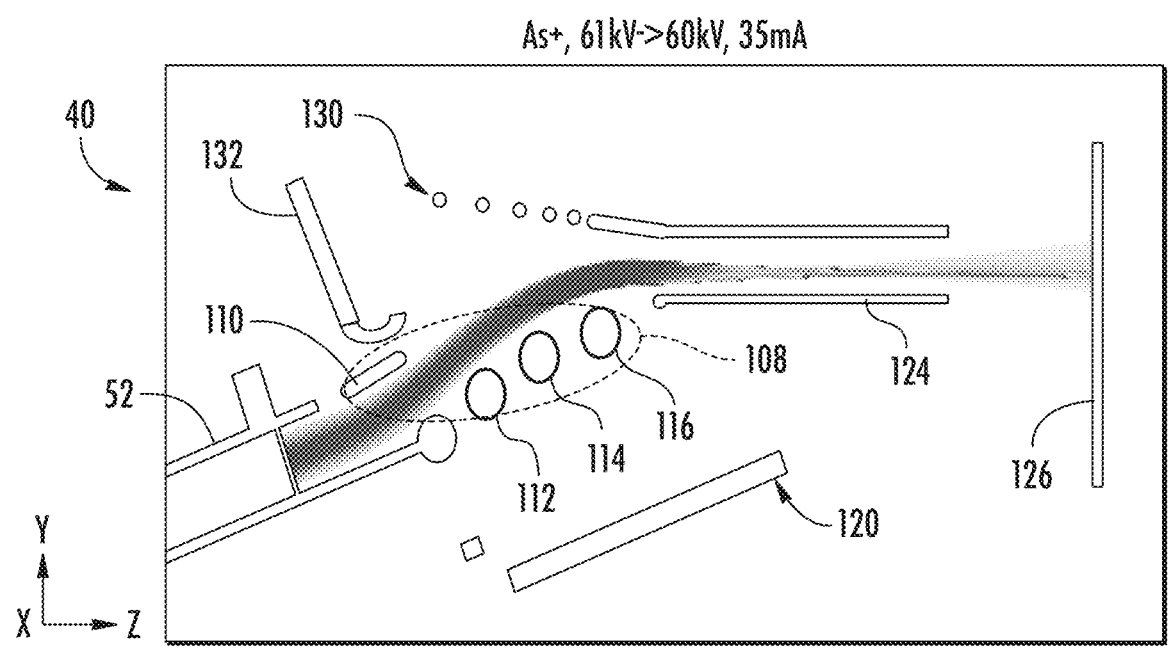
FIG. 7 illustrates a simulation of an ion beam transport in the exemplary electrostatic filter configuration of FIG. 5, according to additional embodiments of the disclosure.

FIG. 6 and FIG. 7 show depictions of ion beams corresponding to the configurations of FIG. 4 and FIG. 5, respectively. Thus, the electrostatic filter 40 is effective in conducting a larger current to the substrate 126 over a wide range of ion energy.

Moreover, while the above embodiments illustrate configurations having three electrodes on one side of a beam path, in other configurations, four electrodes, five electrodes, or more may be arranged on one side of the beam path. Additionally, while the above embodiments show just one electrode on the opposite side of the beam path, in other embodiments, more than one electrode may be arranged on the opposite side of the beam path.

Figure 8:
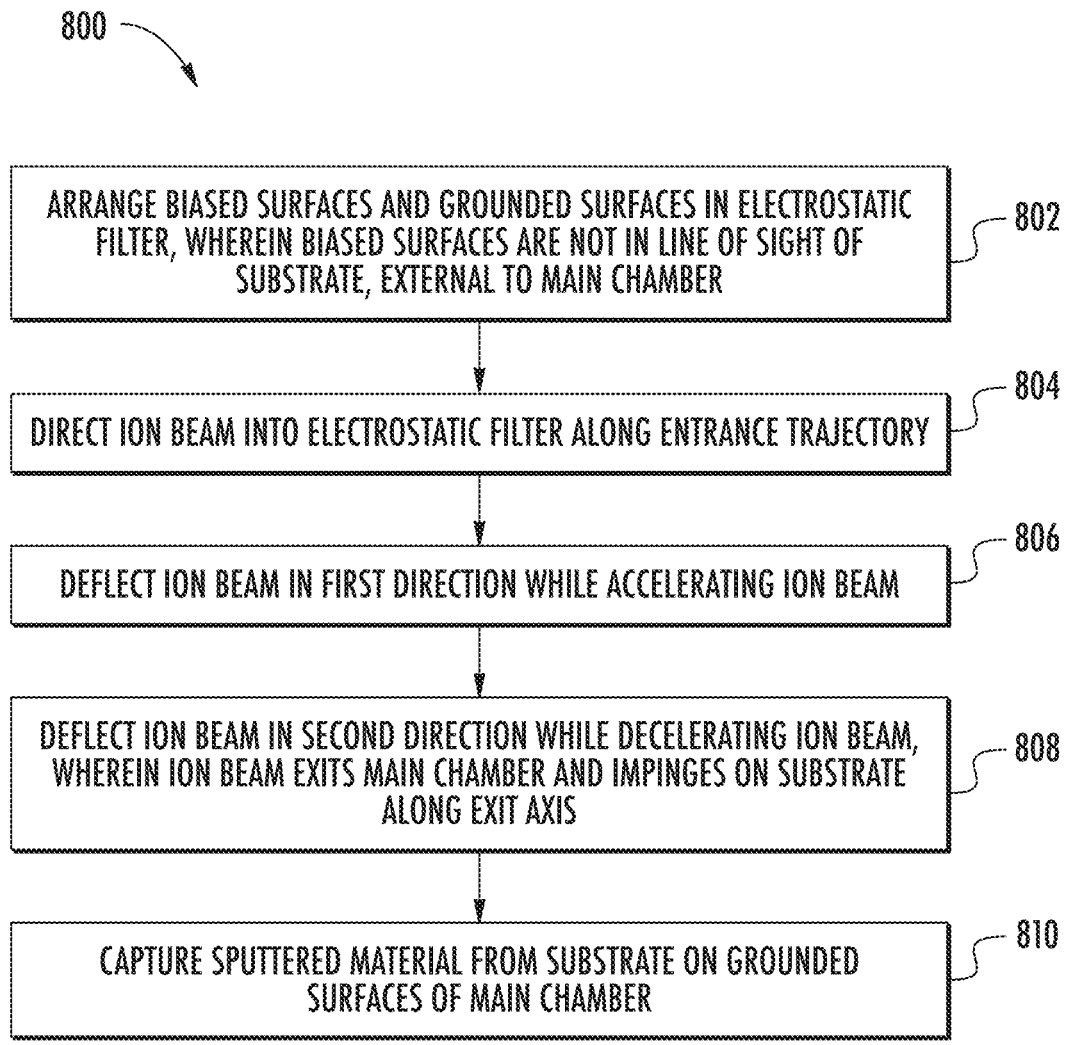
FIG. 8 depicts an exemplary process flow according to some embodiments of the disclosure.

Turning to FIG. 8, there is shown a process flow 800, according to various embodiments of the disclosure. At block 802 various grounded surfaces and biased surfaces are arranged in an electrostatic filter to provide a configuration where the biased surfaces are not in line of sight of a substrate, disposed just downstream of the electrostatic filter. The biased surfaces may include an electrode assembly, and may be biased negatively with respect to ground in embodiments of processing a positive ion beam. The grounded surfaces may include chamber walls of the main chamber of the electrostatic filter, an exit tunnel, as well as a ground assembly, disposed above the electrode assembly.

At block 804 an ion beam is directed into the electrostatic filter along an entrance axis. The ion beam may be directed at an initial ion energy through an entrance tunnel, where the entrance axis is defined by the entrance tunnel, such as parallel to the walls of the entrance tunnel.

At block 806, the ion beam is deflected in a first direction while being accelerated. For example, the ion beam may enter the electrostatic filter with a first ion energy. At least one electrode of the electrode assembly may be biased at an electrode voltage (potential), such as a more negative potential than the entrance tunnel, where the electrode voltage increases the ion energy of the ion beam. At the same time, the electrodes may establish an electrostatic filed that deflects the ion beam along the first direction.

At block 808 the ion beam is deflected in a second direction while decelerating the ion beam. The second direction may be generally opposite the first direction, wherein the ion beam exits a main chamber of the electrostatic filter along an exit axis. The entrance axis and the exit axis may define a beam bend therebetween of 25 degrees or less. As such the ion beam may impinge on the substrate as generally travelling along the exit axis.

At block 810, sputtered material from the substrate is captured on grounded surfaces of the main chamber of the electrostatic filter. In some examples, the sputtered material may be captured in a capture assembly provided along an entrance wall of the main chamber.

In view of the foregoing, at least the following advantages are achieved by the embodiments disclosed herein. The present embodiments provide a first advantage in that direct contamination of a substrate from an electrostatic filter is reduced by eliminating the ability for negatively charged particles generated the filter electrodes from striking the substrate. In addition, another advantage provided by the present embodiments is the elimination of indirect substrate contamination resulting from accumulation of resputtered material from the substrate on electrodes of the electrostatic filter, resulting in an additional contamination source do to subsequent sputtering or flaking from the electrodes. A further advantage conveyed by the present embodiments is the reduced maintenance afforded by the catch assembly, where resputtered material may be collected on easily-serviceable surfaces.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. An apparatus, comprising:
 a main chamber;
 an entrance tunnel, the entrance tunnel having an entrance axis extending into the main chamber;
 an exit tunnel, connected to the main chamber and defining exit axis direction, wherein the entrance tunnel and the exit tunnel define a beam bend of less than 25 degrees therebetween;
 an electrode assembly, disposed in the main chamber, on a lower side of the exit tunnel; and
 a catch assembly, disposed within the main chamber, in a line of sight from an exterior aperture of the exit tunnel.

2. The apparatus of claim 1, wherein the main chamber comprises an entrance wall, wherein the entrance tunnel extends through the entrance wall, and wherein the catch assembly forms at least a portion of the entrance wall.

3. The apparatus of claim 1, wherein the catch assembly further comprises a catch ledge, extending at an angle from the entrance wall.

4. The apparatus of claim 1, wherein the electrode assembly comprises an upper electrode and a plurality of lower electrodes, wherein the electrode assembly is not disposed in the line of sight from the exterior aperture.

5. The apparatus of claim 4, wherein the electrode assembly is disposed below the exit tunnel.

6. The apparatus of claim 1, wherein the catch assembly further comprises a catch ledge, disposed above the upper electrode and extending at an angle from the entrance wall.

7. The apparatus of claim 1, further comprising a ground assembly, the ground assembly being disposed above the electrode assembly.

8. The apparatus of claim 7, wherein the ground assembly comprises a plurality of structures, disposed at ground potential, and a plurality of apertures disposed between the plurality of structures.

9. The apparatus of claim 1, wherein the entrance tunnel comprises a lower side, and wherein the lower side comprises a distal end, wherein the distal end exhibits a rounded cross-section.

10. The apparatus of claim 1, wherein the catch assembly and the exit tunnel are disposed at ground potential.

11. The apparatus of claim 1, wherein at least one electrode of the plurality of lower electrodes is arranged to switch from a grounded state to a biased state.

12. An ion implanter, comprising
an ion source to generate an ion beam; and
an electrostatic filter, disposed downstream of the ion source, to control the ion beam, the electrostatic filter comprising:
a main chamber;
an entrance tunnel, the entrance tunnel having an entrance axis extending into the main chamber;
an exit tunnel, connected to the main chamber and defining exit axis direction, wherein the entrance tunnel and the exit tunnel define a beam bend of less than 25 degrees therebetween;
an electrode assembly, disposed in the main chamber, on a lower side of the exit tunnel; and
a catch assembly, disposed within the main chamber, in a line of sight from an exterior aperture of the exit tunnel.

13. The ion implanter of claim 12, wherein the electrode assembly comprises an upper electrode and a plurality of lower electrodes, wherein the electrode assembly is not disposed in the line of sight from the exterior aperture.

14. The ion implanter of claim 13, wherein the electrode assembly is disposed below the exit tunnel.

15. The ion implanter of claim 12, further comprising a ground assembly, the ground assembly being disposed above the electrode assembly.

16. The ion implanter of claim 15, wherein the ground assembly comprises a plurality of structures, disposed at ground potential, and a plurality of apertures disposed between the plurality of structures.

17. An electrostatic filter, comprising:
a main chamber, including a chamber wall, set at ground potential;
an entrance tunnel, biased at a first potential and having an entrance axis extending into the main chamber;
an exit tunnel, connected to the main chamber and defining an exit axis, wherein the entrance tunnel and the exit tunnel define a beam bend of less than 25 degrees therebetween;
an electrode assembly, disposed in the main chamber, on a lower side of the exit tunnel; and
a catch assembly, set at ground potential, and disposed within the main chamber, in a line of sight from an exterior aperture of the exit tunnel.

18. The electrostatic filter of claim 17, wherein the electrode assembly and the entrance tunnel are not disposed in the line of sight from the exterior aperture.

19. The apparatus of claim 18, wherein the catch assembly further comprises a catch ledge, extending at an angle from a chamber wall of the main chamber.

* * * * *